(12) United States Patent
Takakuwa et al.

(10) Patent No.: US 9,087,875 B2
(45) Date of Patent: Jul. 21, 2015

(54) PATTERN FORMATION METHOD FOR MANUFACTURING SEMICONDUCTOR DEVICE USING PHASE-SEPARATING SELF-ASSEMBLING MATERIAL

(71) Applicant: KABUSHIKI KAISHA TOSHIBA, Minato-ku, Tokyo (JP)

(72) Inventors: Manabu Takakuwa, Mie-ken (JP); Masaki Hirano, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/010,715

(22) Filed: Aug. 27, 2013

(65) Prior Publication Data

US 2014/0242799 A1    Aug. 28, 2014

(30) Foreign Application Priority Data

Feb. 28, 2013 (JP) ................. 2013-039453

(51) Int. Cl.
| | |
|---|---|
| *H01L 21/308* | (2006.01) |
| *H01L 21/768* | (2006.01) |
| *H01L 21/027* | (2006.01) |
| *B81C 1/00* | (2006.01) |

(52) U.S. Cl.
CPC ...... *H01L 21/76802* (2013.01); *B81C 1/00031* (2013.01); *H01L 21/0271* (2013.01); *H01L 21/76816* (2013.01); *B81C 2201/0149* (2013.01)

(58) Field of Classification Search
CPC ............ H01L 21/3081; H01L 21/76229; H01L 2223/54453; H01L 2223/5442; H01L 2223/54426; H01L 23/544; Y10S 438/975; B32B 3/30

USPC ............... 438/197; 257/E21.232, E23.179, 257/E21.548
See application file for complete search history.

(56) References Cited

U.S. PATENT DOCUMENTS

| | | | |
|---|---|---|---|
| 6,667,221 B2 | 12/2003 | Kitazawa et al. | |
| 2003/0157755 A1* | 8/2003 | Kitazawa et al. ............. | 438/197 |
| 2004/0234897 A1* | 11/2004 | Ho et al. ..................... | 430/312 |
| 2009/0191713 A1* | 7/2009 | Yoon et al. .................. | 438/703 |

FOREIGN PATENT DOCUMENTS

KR  10-2012-0069292  * 12/2010 ............... B32B 3/30

OTHER PUBLICATIONS

Trans-KR-10-2010-0130785: English Translation of KR10-2012-0069292, Sa-Ra Kim et al., KIPO.*

* cited by examiner

*Primary Examiner* — Selim Ahmed
*Assistant Examiner* — Changhyun Yi
(74) *Attorney, Agent, or Firm* — Finnegan, Henderson, Farabow, Garrett & Dunner, L.L.P.

(57) ABSTRACT

According to one embodiment, a pattern formation method includes forming a first mask layer including a first and a second concave pattern on a first surface of a substrate. The method can include providing a protection film in the first concave pattern. The method can include providing a self-assembling material in the second concave pattern. The method can include forming a first and a second phase in the second concave pattern by phase-separating the self-assembling material. The method can include removing the protection film together with the first phase to form a second mask layer having the first concave pattern and a third concave pattern. The third concave pattern is provided in the second concave pattern, and has an opening width narrower than an opening width of the second concave pattern. The method can include processing the substrate using the second mask layer as a mask.

18 Claims, 8 Drawing Sheets

US 9,087,875 B2

PATTERN FORMATION METHOD FOR MANUFACTURING SEMICONDUCTOR DEVICE USING PHASE-SEPARATING SELF-ASSEMBLING MATERIAL

CROSS-REFERENCE TO RELATED APPLICATIONS

This application is based upon and claims the benefit of priority from Japanese Patent Application No. 2013-039453, filed on Feb. 28, 2013; the entire contents of which are incorporated herein by reference.

FIELD

Embodiments described herein relate generally to a pattern formation method and a method for manufacturing a semiconductor device.

BACKGROUND

The need for technology for forming a fine pattern is increased with the progress of integration of semiconductor devices. As a technology for coping with the miniaturization of patterns, a pattern formation method utilizing the microphase separation of a self-assembling material is drawing attention. In microfabrication technology, it is necessary to arrange separated phases into a prescribed arrangement with a guide pattern as a reference. To form a pattern by utilizing the microphase separation of a self-assembling material, it is important to phase-separate the self-assembling material with good accuracy.

DETAILED DESCRIPTION

Figure 1:
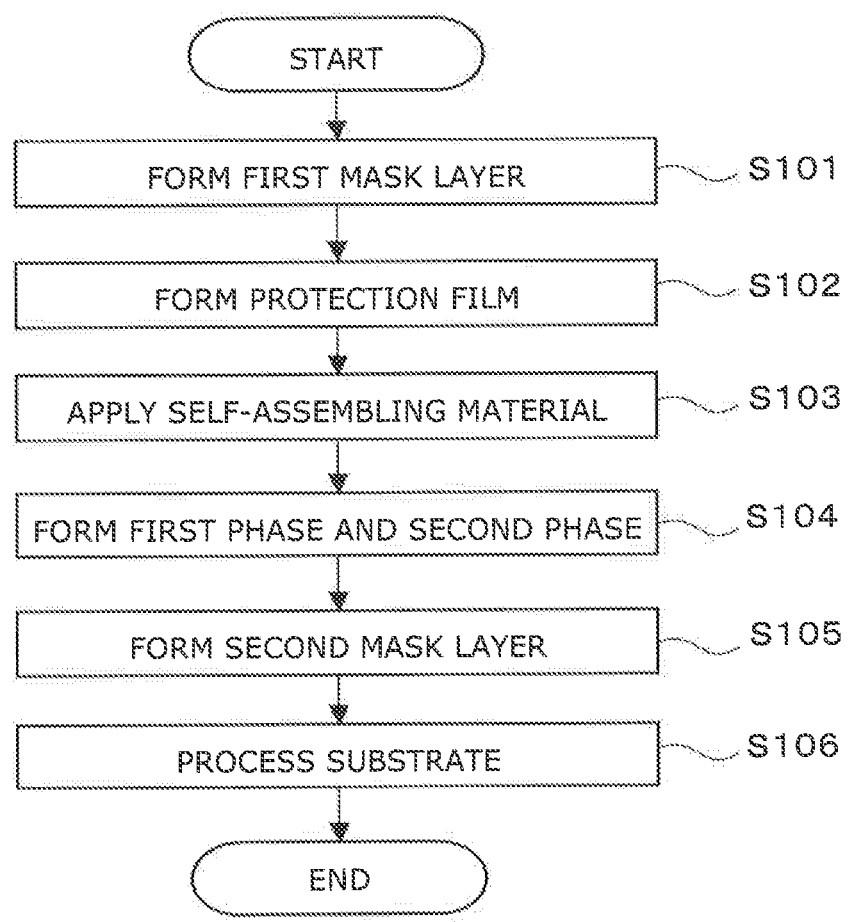
FIG. 1 is a flow chart illustrating a pattern formation method according to a first embodiment.

In general, according to one embodiment, a pattern formation method includes forming a first mask layer including a first concave pattern and a second concave pattern on a first surface of a substrate. The method can include providing a protection film in the first concave pattern. The method can include providing a self-assembling material in the second concave pattern. The method can include forming a first phase and a second phase in the second concave pattern by phase-separating the self-assembling material. The method can include removing the protection film together with the first phase to form a second mask layer having the first concave pattern and a third concave pattern. The third concave pattern is provided in the second concave pattern. The third concave pattern has an opening width narrower than an opening width of the second concave pattern. The method can include processing the substrate using the second mask layer as a mask.

Various embodiments will be described hereinafter with reference to the accompanying drawings.

Hereinbelow, embodiments of the invention are described based on the drawings. In the following description, identical components are marked with the same reference numerals, and a description of components once described is omitted as appropriate.

First Embodiment

FIG. 1 is a flow chart illustrating a pattern formation method according to a first embodiment.
FIG. 2A to FIG. 5 are schematic cross-sectional views illustrating a pattern formation method according to the first embodiment.

As shown in FIG. 1, the pattern formation method according to the first embodiment includes forming a first mask layer (step S101), forming a protection film (step S102), applying a self-assembling material (step S103), forming a first phase and a second phase (step S104), forming a second mask layer (step S105), and processing a substrate (step S106).

Figure 2A:
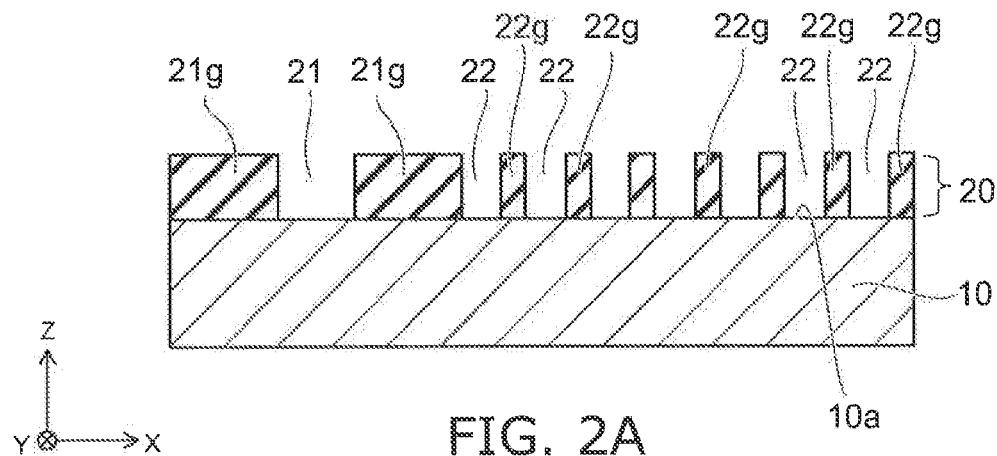
FIG. 2A to FIG. 5 are schematic cross-sectional views illustrating a pattern formation method according to the first embodiment.

In step S101, as shown in FIG. 2A, a substrate 10 having a first surface 10a is prepared, and a first mask layer 20 is formed on the first surface 10a of the substrate 10. In the embodiment, the direction perpendicular to the first surface 10a is defined as the Z direction, one direction orthogonal to the Z direction is defined as the X direction, and the direction orthogonal to the Z direction and the X direction is defined as the Y direction.

The first mask layer 20 includes a first concave pattern 21 and a second concave pattern 22. The first mask layer 20 includes a first guide pattern 21g and a second guide pattern 22g. The first guide pattern 21g and the second guide pattern 22g are convex patterns. The first concave pattern 21 is provided between two first guide patterns 21g. The second concave pattern 22 is provided between two second guide patterns 22g.

Figure 3A:
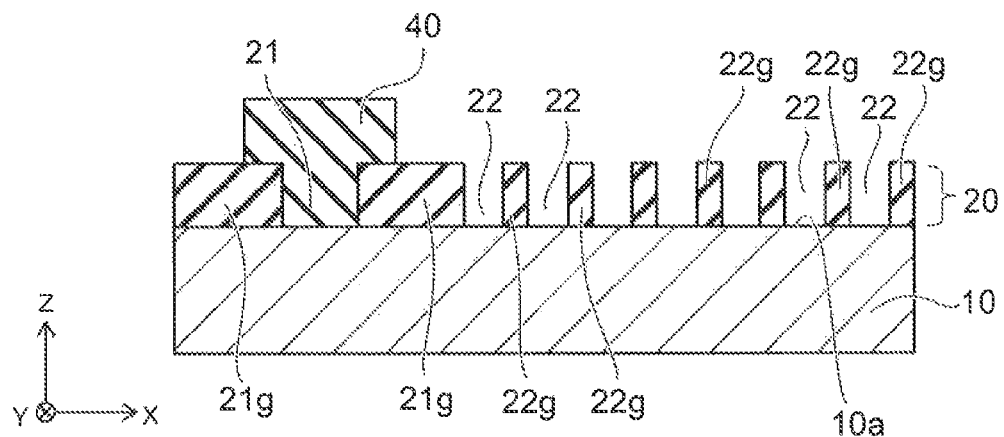

In step S102, as shown in FIG. 3A, a protection film 40 is provided in the first concave pattern 21 of the first mask layer 20 by a photolithography process using a positive resist or a negative resist. The protection film 40 is buried in the first concave pattern 21. The protection film 40 may be provided on the first mask layer 20 to have a prescribed thickness. The protection film 40 is not provided in the second concave pattern 22.

Figure 3B:
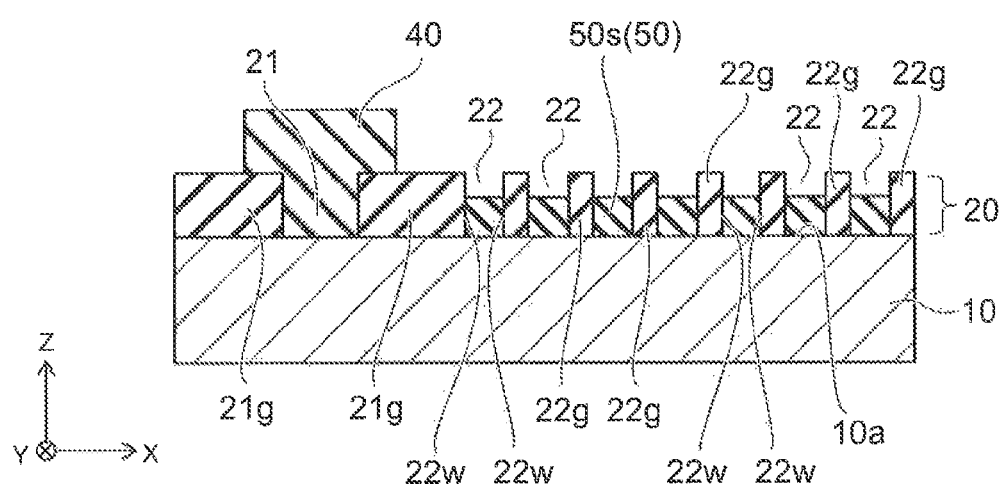

In step S103, as shown in FIG. 3B, a self-assembling material 50 is applied in the second concave pattern 22 of the first mask layer 20. A diblock copolymer is used as the self-assembling material 50, for example. The diblock polymer includes a first segment and a second segment. Since the protection film 40 is provided in the first concave pattern 21, the self-assembling material 50 is not applied in the first concave pattern 21.

Figure 3C:
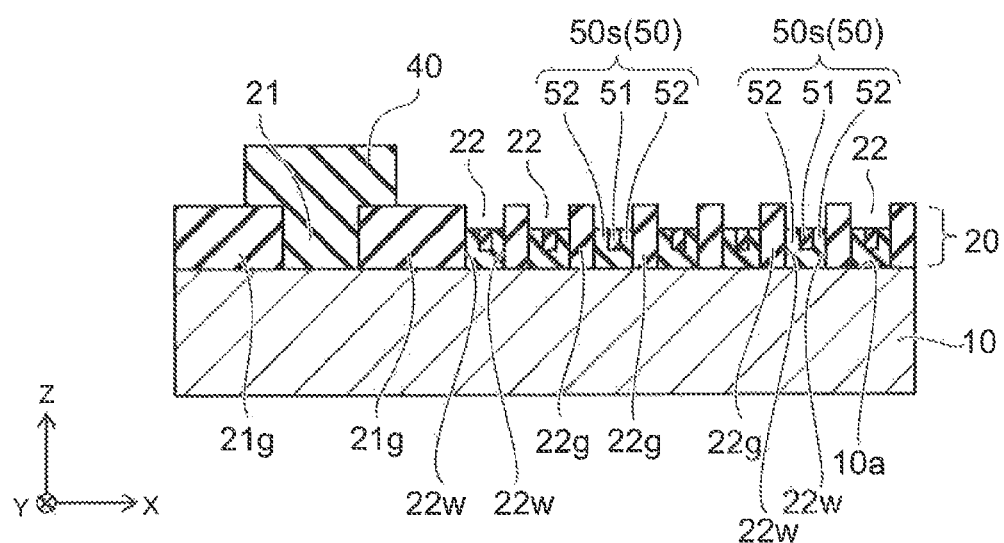
Figure 4A:
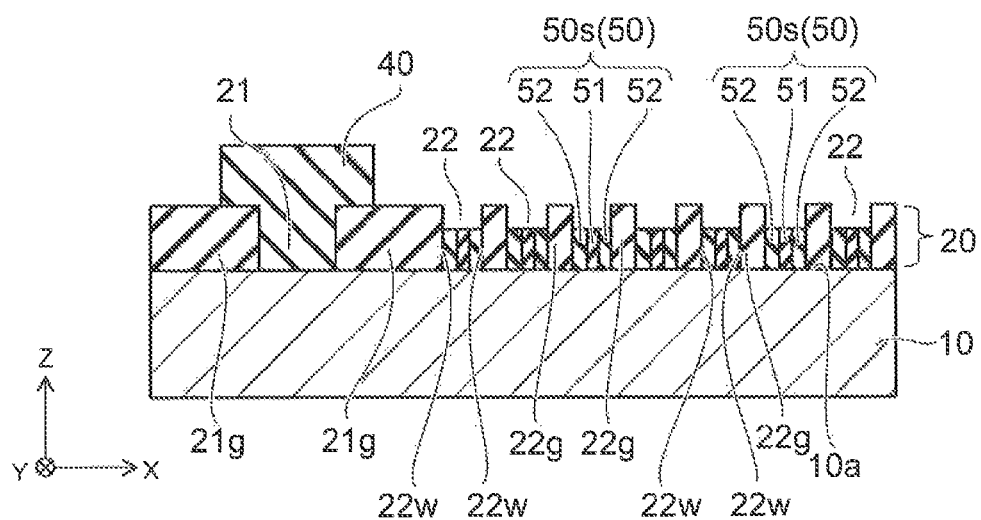

In step S104, as shown in FIG. 3C and FIG. 4A, the self-assembling material 50 in the second concave pattern 22 is microphase-separated to form a first phase 51 and a second phase 52. For example, a diblock copolymer solution 50s is heated to a prescribed temperature. Thereby, the diblock copolymer solution 50s is microphase-separated. Consequently, the first phase 51 formed of the first segment and the second phase 52 formed of the second segment are formed in the second concave pattern 22, for example.

Each of the first phase 51 and the second phase 52 is arranged along the inner wall 22w of the second concave pattern 22, for example. FIG. 4A shows each of the first phase 51 and the second phase 52 formed by the microphase separation of the diblock copolymer solution 50s. Each of the first phase 51 and the second phase 52 is formed in a layer form parallel to, for example, the Y-Z plane, which is a surface of the inner wall 22w of the second concave pattern 22.

Each of the first phase 51 and the second phase 52 is oriented in the Z direction, for example, and extends along the inner wall 22w. The second phase 52 is provided so as to be in contact with adjacent two second guide patterns 22g in the second concave pattern 22, for example. The first phase 51 is provided between two second phases 52 in the second concave pattern 22, for example. The first phase 51 is not in contact with the second guide pattern 22g.

Figure 4B:
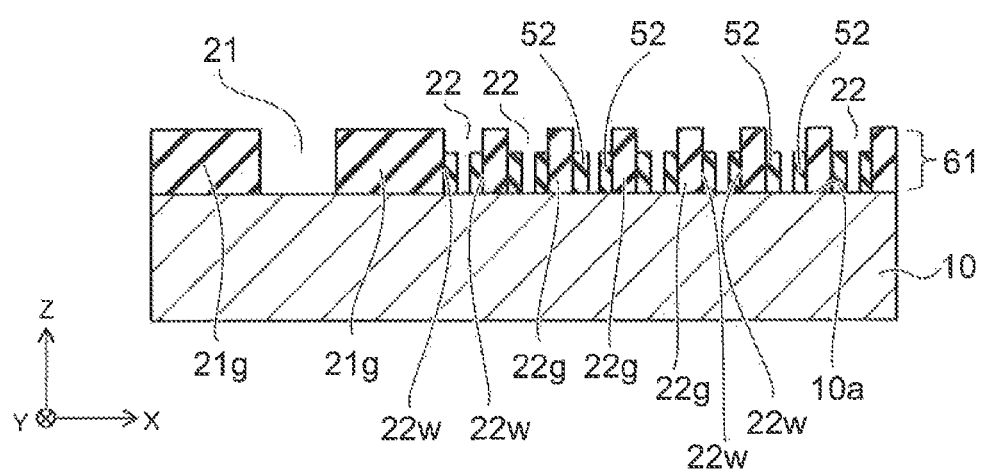

In step S105, as shown in FIG. 4B, the protection film 40 is removed together with the first phase 51 to form a second mask layer 61. Herein, the first phase 51 and the protection film 40 are removed in the same processing process. For example, the first phase 51 and the protection film 40 are removed in the same process using the same etchant. In the case where the etching rate of the first phase 51 and the etching rate of the protection film 40 are different, the etching time of the first phase 51 and the etching time of the protection film 40 may be equalized by adjusting the thickness of the protection film 40.

By removing the protection film 40 together with the first phase 51, the second mask layer 61 is formed on the substrate 10. The second mask layer 61 has the first concave pattern 21 and a third concave pattern 23.

The third concave pattern 23 is provided in the second concave pattern 22. The third concave pattern 23 is a concave pattern provided in the portion where the first phase 51 has been removed. The opening width w2 of the third concave pattern 23 is narrower than the opening width w1 of the second concave pattern 22.

Here, the opening width is the length in the X direction of the opening of the concave pattern (the first concave pattern 21, the second concave pattern 22, and the third concave pattern 23).

Figure 4C:
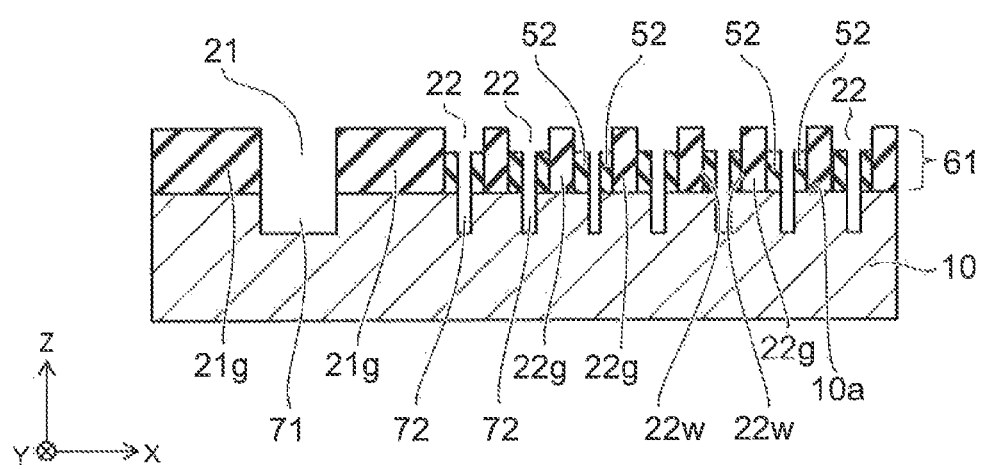
Figure 5:
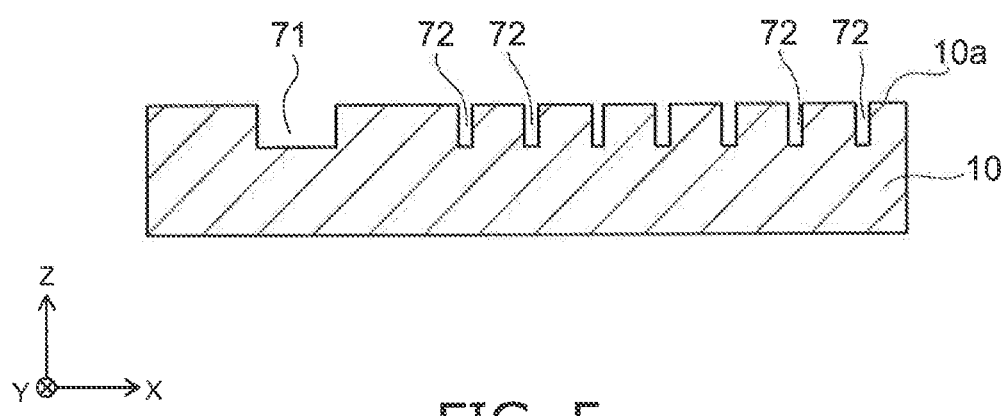

In step S106, as shown in FIG. 4C, the second mask layer 61 is used as a mask to process the substrate 10. Thereby, a first pattern 71 corresponding to the first concave pattern 21 and a second pattern 72 corresponding to the third concave pattern are formed.

By the pattern formation method of the embodiment, when forming a fine pattern, both pattern formation utilizing microphase separation and pattern formation not utilizing microphase separation can be performed. For example, in the case of forming a second pattern 72 finer than the limit of photolithography, the microphase separation of a self-assembling material is used for the formation of a mask for forming the third second pattern 72. On the other hand, in the case of forming a first pattern 71 with a wider width than the second pattern 72 like, for example, an alignment mark, microphase separation using a self-assembling material is not suitable for the formation of a mask for forming the first pattern 71. Thus, for the formation of the mask for forming the first pattern 71, the pattern of the mask is formed without producing microphase separation using a self-assembling material. In the embodiment, a pattern utilizing microphase separation and a pattern not utilizing microphase separation can be formed efficiently.

Next, a specific example of the pattern formation method according to the first embodiment is described.

First, as shown in FIG. 2A, the substrate 10 having the first surface 10a is prepared. An arbitrary substrate such as a semiconductor wafer, an insulating substrate, and a conductive substrate is used as the substrate 10. For example, in the case of forming a pattern of a semiconductor device, a silicon wafer, a doped silicon wafer, a silicon wafer on which surface an insulating layer or a metal layer that forms an electrode or an interconnection is formed, SiC, a group III-V compound semiconductor wafer of GaAs, GaN, or the like, etc. are used. In the case of forming a pattern of a photomask or a mold for imprinting, a glass substrate of quartz or the like is used.

Next, a resist film is formed on the first surface 10a of the substrate 10 by, for example, spin coating. Next, the resist film is selectively irradiated with light and development is performed to form the first mask layer 20 including the first concave pattern 21 and the second concave pattern 22.

In the case of forming a pattern of a semiconductor device, the opening width of the first concave pattern 21 is 200 nanometers (nm), for example. The first concave pattern 21 is a pattern for forming an alignment mark, for example. The opening width of the second concave pattern 22 is 40 nm, for example. The second concave pattern 22 is formed on a region where the device will be formed, for example. The second concave pattern 22 is provided along the second guide pattern 22g that is a convex pattern.

Figure 2B:
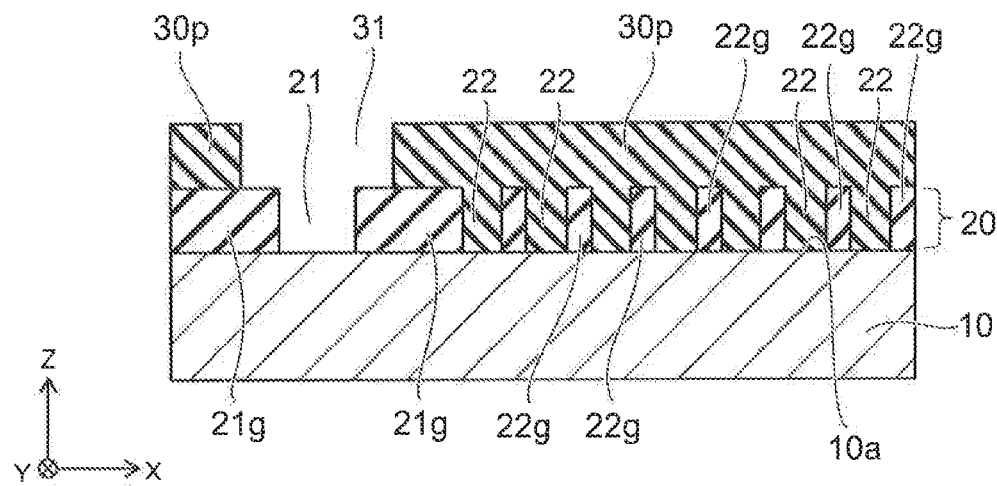

Next, a protection film is formed in the first concave pattern 21 by a photolithography process. As shown in FIG. 2B, a positive resist film 30p is formed on the first mask layer 20 by, for example, spin coating. Subsequently, the positive resist film 30p in the region of the second concave pattern 22 is selectively irradiated with light and development is performed. Thereby, an opening 31 is formed in a region including the first concave pattern 21.

Figure 2C:
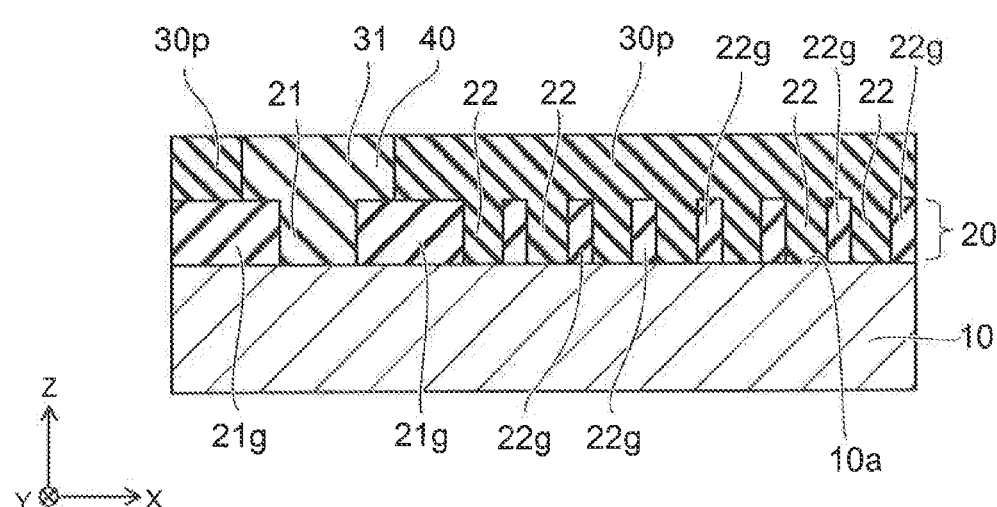

Next, as shown in FIG. 2C, the protection film 40 is formed in the first concave pattern 21 and in the opening 31. To form the protection film 40, first, the material of the protection film is applied in the first concave pattern 21, in the opening 31, and on the resist film 30p. After that, the material of the protection film on the opening 31 is selectively irradiated with light and development is performed. Thereby, as shown in FIG. 2C, the protection film 40 remains only in the first concave pattern 21 and in the opening 31.

Next, the resist film 30p is removed. Thereby, as shown in FIG. 3A, the protection film 40 buried in the first concave pattern 21 is formed. As the method for forming the protection film 40, the lift-off method may be used in which the material of the protection film is applied in the first concave pattern, in the opening 31, and on the resist film 30p and then the resist film 30p is removed.

As the polymer contained in the protection film 40, one selected from the group consisting of an alkali-soluble material, an acid-soluble material, and a water-soluble material is used. The polymer contained in the protection film 40 is preferably the same polymer as the polymer contained in the first phase 51 of the self-assembling material 50. By employing a configuration in which the same polymer as the polymer contained in the first phase 51 is used as the polymer contained in the protection film 40, the phase-separated first phase 51 and the protection film 40 can be removed by the same etchant.

Next, as shown in FIG. 3B, the self-assembling material 50 is formed in the second concave pattern 22. A diblock copolymer is used as the self-assembling material 50, for example. The diblock copolymer includes the first segment and the second segment that are two different polymer block chains.

Examples of the diblock copolymer include PS-b-PMMA (a block copolymer of polystyrene (PS) and poly(methyl methacrylate) (PMMA)) and the like. In the embodiment, a copolymer of PS and PMMA is used as the diblock polymer.

The diblock copolymer is a material that microphase-separates using the second guide pattern 22g as a guide. For example, the diblock copolymer microphase-separates into a plurality of phases in accordance with the spacing between two second guide patterns 22g (the width of the second concave pattern 22). The phase separation of the objective is produced based on the pitch of a plurality of second guide patterns 22g and the configuration of the second guide pattern 22g, Under the condition of the width of the first concave pattern 21, the diblock copolymer does not produce the microphase separation of the objective.

As the method for forming the self-assembling material 50, first, a diblock copolymer is dissolved in a polyethylene glycol monomethyl ether acetate (PGMEA) solution to prepare the diblock copolymer solution 50s. Next, the diblock copolymer solution 50s is formed on the second concave pattern 22 by, for example, spin coating. The method for forming the self-assembling material 50 on the second concave pattern 22 is not particularly limited. In addition to spin coating, dip coating and other methods are used.

The protection film 40 has already been formed in the first concave pattern 21. Therefore, when the diblock copolymer solution 50s is spin-coated, the diblock copolymer solution 50s does not enter the first concave pattern 21.

Next, the diblock copolymer solution 50s is phase-separated to form the first phase 51 and the second phase 52. For example, the diblock copolymer solution 50s is microphase-separated by heating. FIG. 3C schematically shows a process in the course of the microphase separation of the diblock copolymer solution 50s. FIG. 4A schematically shows a state after the microphase separation of the diblock copolymer solution 50s has finished.

In the case where a line-and-space pattern is used as the second concave pattern 22, the second phase 52 is formed along the inner walls 22w on both sides of the second concave pattern 22, for example. The first phase 51 is formed between two second phases 52 formed along the inner walls 22w in the second concave pattern 22.

The inner wall 22w of the second concave pattern does not necessarily need to be perpendicular to the first surface 10a. Even when the inner wall 22w is formed at angles other than 90 degrees with respect to the first surface 10a, the diblock copolymer is arranged in a layer form along the inner wall 22w. Also in the microphase separation process, the protection film 40 has already been applied in the first concave pattern 21, and therefore the diblock copolymer solution 50s does not enter the first concave pattern due to the phase separation.

Next, the protection film 40 is removed together with the first phase 51. By the first phase 51 being removed, as shown in FIG. 4B, the third concave pattern 23 is formed on the inside of the second concave pattern 22. By the protection film 40 being removed, the first concave pattern 21 is exposed.

The first phase 51 and the protection film 40 are removed by at least one of dry etching and wet etching. By employing a configuration in which the same polymer is used as the polymer contained in the material of the protection film 40 and the polymer contained in the first phase 51, also the protection film 40 is removed in the same processing process as removing the first phase 51, for example. The removal time of the protection film 40 may be made equal to the removal time of the first phase 51 by adjusting the thickness of the protection film 40.

By removing the first phase 51 and the protection film 40, the second mask layer 61 is formed on the substrate 10. The second mask layer 61 has the first concave pattern 21 exposed by the removal of the protection film 40 and the third concave pattern 23 formed by the removal of the first phase 51.

The opening width w2 of the third concave pattern 23 formed is smaller than the opening width w1 of the second concave pattern 22. The third concave pattern 23 is used as an opening of a mask for forming a region, an interconnection, etc. of a semiconductor device etc. In this case, w1 is approximately 40 nm, for example, and w2 is approximately 10 nm, for example.

Next, the second mask layer 61 is used as a mask to etch the substrate 10. RIE (reactive ion etching) using a fluorine-based gas is used as the etching, for example. By the substrate 10 being processed using the second mask layer 61 as a mask, as shown in FIG. 4C, the first pattern 71 and the second pattern 72 are formed on the substrate 10. The first pattern 71 is a concave pattern formed on the substrate 10 to correspond to the first concave pattern 21. The second pattern 72 is a concave pattern formed on the substrate 10 to correspond to the third concave pattern 23. The second pattern 72 is a fine pattern in accordance with the width of the third concave pattern 23.

After that, the second mask layer 61 is removed. Thereby, a microfabricated substrate 10 is obtained as shown in FIG. 5A.

REFERENCE EXAMPLE

Here, a pattern formation method according to a reference example is described.

FIG. 6A to FIG. 7C are schematic views showing a pattern formation method according to the reference example. In the pattern formation method according to the reference example, pattern formation utilizing the microphase separation of a self-assembling material is performed without forming the protection film 40 in the first concave pattern 21.

Figure 6A:
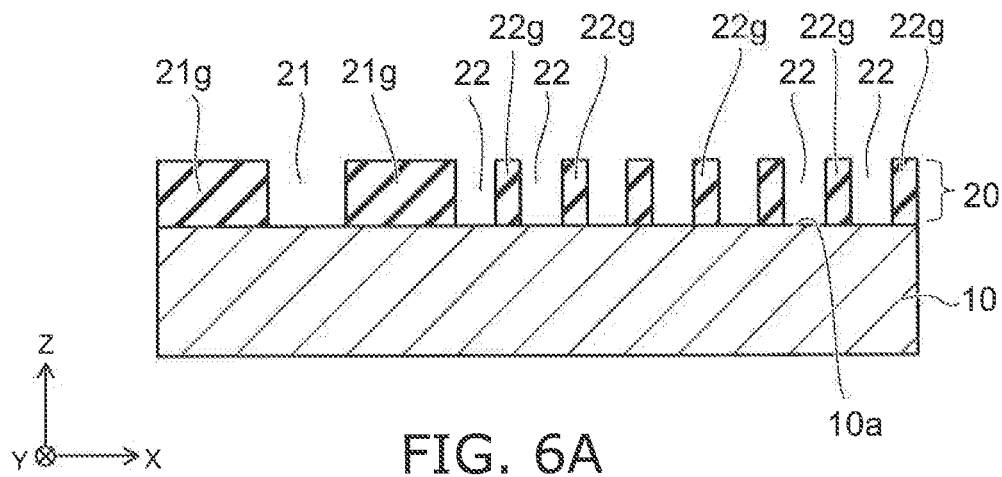
FIG. 6A to FIG. 7C are schematic views showing a pattern formation method according to the reference example.

First, as shown in FIG. 6A, the substrate 10 having the first surface 10a is prepared similarly to the first embodiment. A resist film is formed on the substrate 10 by spin coating. Next, the resist film is selectively irradiated with light and development is performed to form the first mask layer 20 including the first concave pattern 21 and the second concave pattern 22.

Figure 6B:
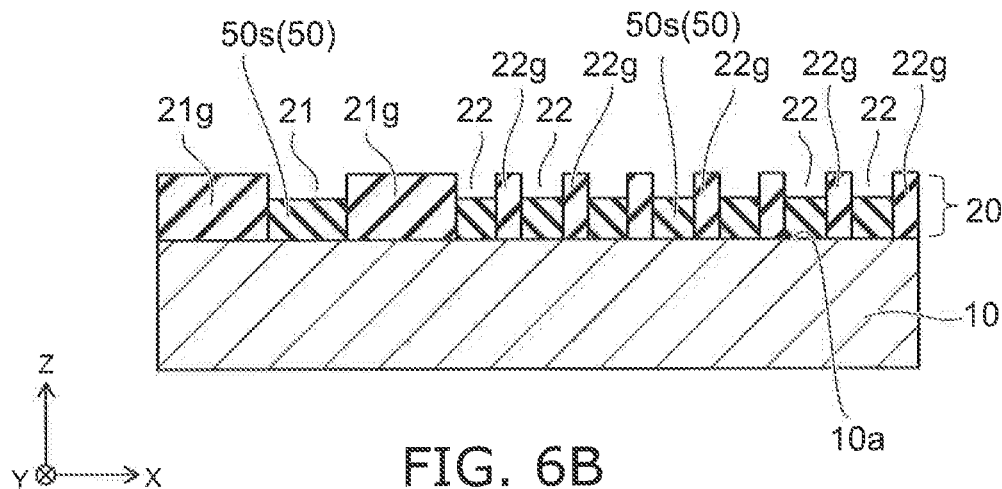

Next, as shown in FIG. 6B, the self-assembling material 50 is formed in the first concave pattern and the second concave pattern 22. The same material as the first embodiment, for example a diblock copolymer, is used as the self-assembling material 50. As the method for forming the self-assembling material 50, the diblock copolymer solution 50s is applied on the first mask layer 20 by, for example, spin coating. The diblock copolymer solution 50s is applied in the first concave pattern 21 and in the second concave pattern 22 of the first mask layer 20.

Figure 6C:
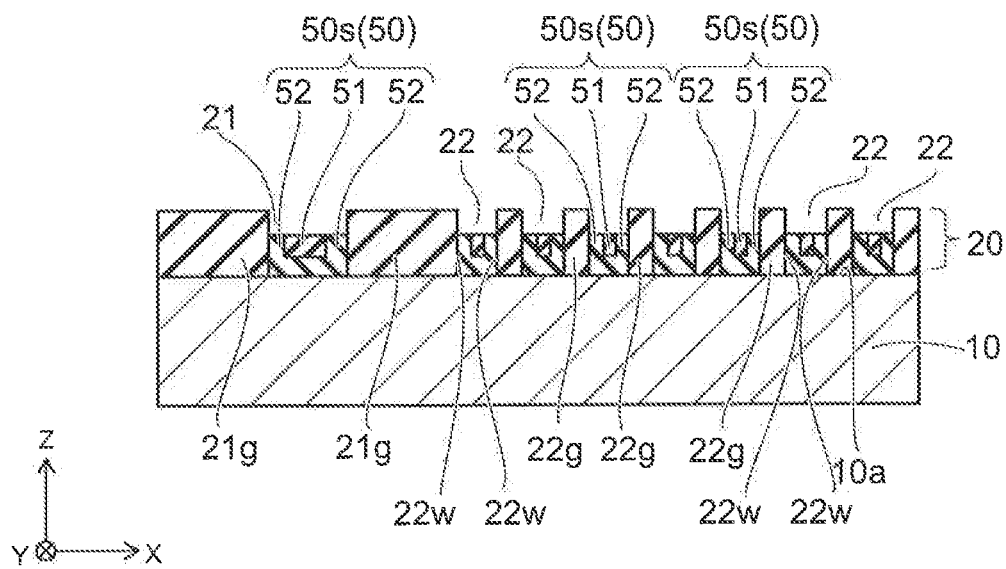
Figure 7A:
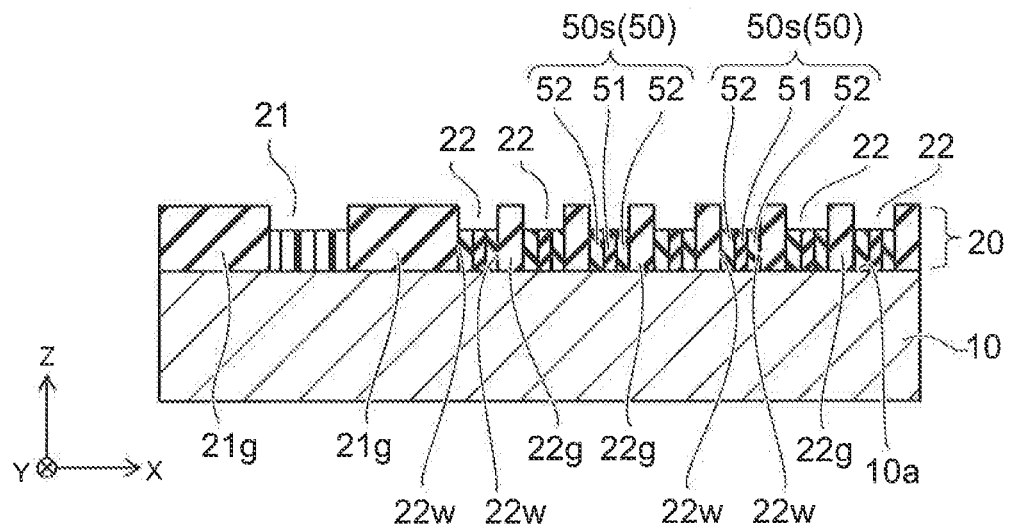

Next, the diblock copolymer solution 50s is heated to microphase-separate the diblock copolymer solution 50s into the first phase 51 and the second phase 52. FIG. 6C schematically shows a process in the course of the microphase separation of the diblock copolymer solution 50s. FIG. 7A schematically shows a state after the microphase separation of the diblock copolymer solution 50s has finished.

In the case where a line-and-space pattern is used as the second concave pattern 22 similarly to the first embodiment, the second phase 52 is formed along the inner walls 22w on both sides of the second concave pattern 22. The first phase 51 is formed between two second phases 52 formed along the inner walls 22w in the second concave pattern 22.

On the other hand, it is difficult for the diblock copolymer solution 50s in the first concave pattern 21 to microphase-separate in a layer form along the inner wall 21w of the first concave pattern. That is, the diblock copolymer, for example, used as the self-assembling material 50 is provided so as to microphase-separate into the first phase 51 and the second phase 52 in accordance with the spacing between two second guide patterns 22g (the width of the second concave pattern 22). Therefore, in the first concave pattern 21 having a width wider than the width of the second concave pattern 22, the diblock copolymer solution 50s cannot be microphase-separated clearly.

Next, the first phase 51 is removed. The first phase 51 is removed by at least one of dry etching and wet etching. Thereby, the third concave pattern 23 is formed on the inside of the second concave pattern 22.

On the other hand, in the first concave pattern 21, the first phase 51 and the second phase 52 are not clearly phase-separated in a layer form. That is, in the first concave pattern 21, the condition is a state where the first phase 51 and the second phase 52 exist mixedly. When the first phase is removed in this state, an inner surface 24 with large roughness is formed inside the first concave pattern 21.

Figure 7B:
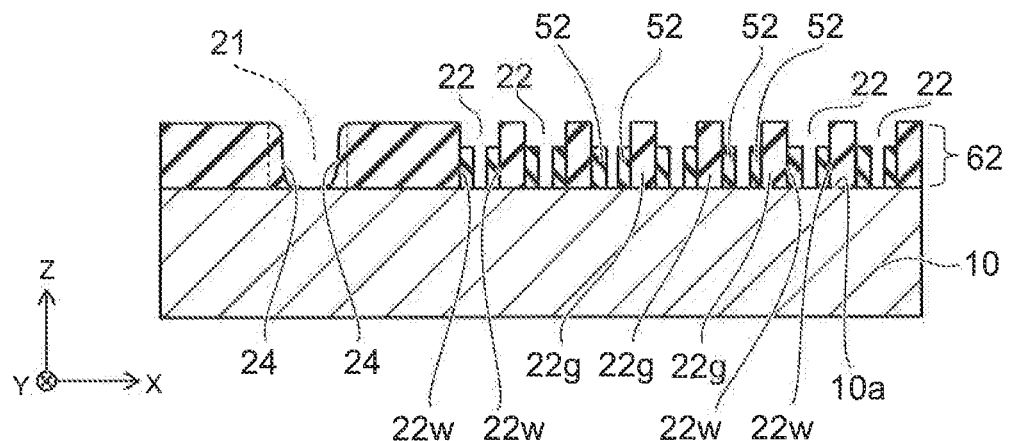

By removing the first phase 51, as shown in FIG. 7B, a second mask layer 62 is formed on the substrate 10. The second mask layer 62 includes the first concave pattern 21 having the inner surface 24 and a third concave pattern 23.

Figure 7C:
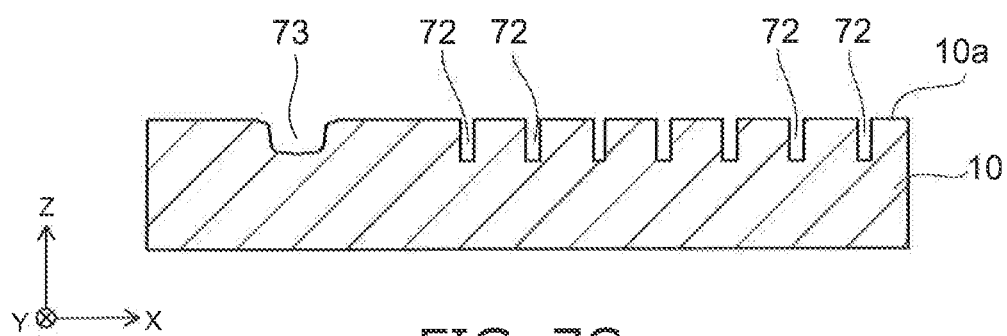

Next, the second mask layer 62 is used as a mask to etch the substrate 10. RIE using a fluorine-based gas is used as the etching, for example. Thereby, as shown in FIG. 7C, a first pattern 73 and a second pattern 72 are formed on the substrate 10. Here, the second pattern 72 is a concave pattern formed to correspond to the third concave pattern 23. The second pattern 72 forms a fine pattern in accordance with the width of the third concave pattern 23 similarly to the first embodiment.

On the other hand, the first pattern 73 is a concave pattern formed to correspond to the first concave pattern 21 having the inner surface 24. In the first pattern 73, the influence of the roughness of the inner surface 24 appears. Thus, the first pattern 73 is not a clear concave pattern.

In the pattern formation method according to the reference example, in the case where the first pattern 73 is used as, for example, an alignment mark, it is difficult to make high accuracy alignment. The first pattern 73 is not a clear concave pattern. Therefore, when this is used as an alignment mark to form another layer on the substrate 10 by an exposure process, alignment with high accuracy is difficult.

In contrast, in the pattern formation method according to the first embodiment, the first pattern 71 can be formed with a clear configuration. Therefore, when the first pattern 71 is used as an alignment mark to form another layer on the substrate 10, alignment with high accuracy can be made.

Second Embodiment

Next, a second embodiment is described.

Figure 8A:
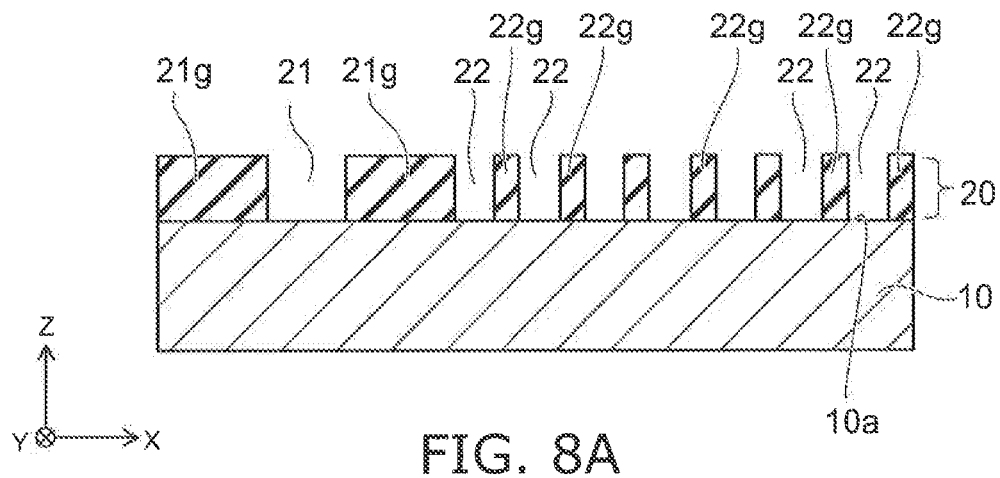
FIG. 8A to FIG. 8C are schematic cross-sectional views illustrating a pattern formation method according to the second embodiment.
Figure 8B:
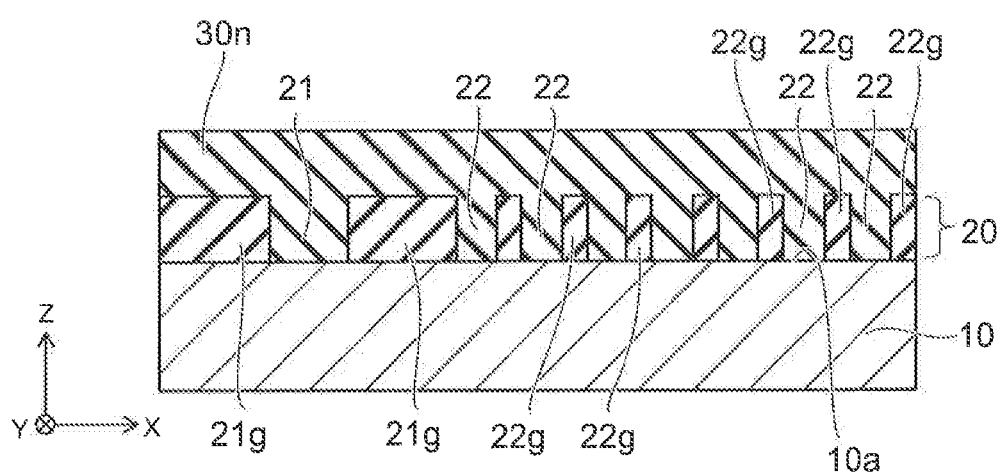
Figure 8C:
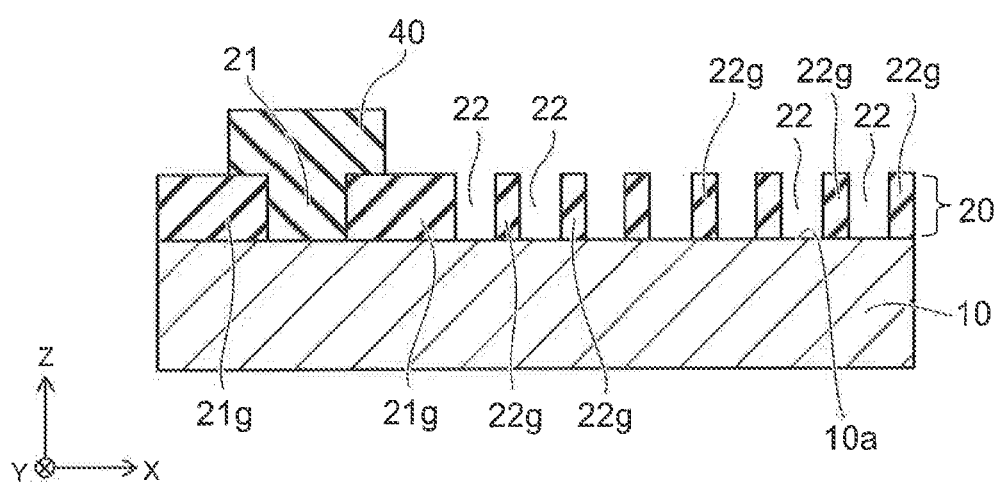

A pattern formation method according to the second embodiment is the same as the first embodiment except for forming the protection film (step S102) in the pattern formation method according to the first embodiment FIGS. 8A to 8C are schematic cross-sectional views illustrating a pattern formation method according to the second embodiment.

First, as shown in FIG. 8A, the first mask layer 20 including the first concave pattern 21 and the second concave pattern 22 is formed on the first surface 10a of the substrate 10. The method for forming the first mask layer 20 is similar to the first embodiment shown in FIG. 2A.

Next, as shown in FIG. 8B, a negative resist film 30n is formed on the first mask layer 20 by, for example, spin coating. The resist film 30n is applied on the first mask layer 20, in the first concave pattern 21, and in the second concave pattern 22.

Subsequently, the negative resist film 30n in the region of the first concave pattern 21 is selectively irradiated with light and development is performed. Thereby, as shown in FIG. 8C, the protection film 40 is formed in the first concave pattern 21. The processes after the protection film 40 is formed are similar to those of the first embodiment.

In the pattern formation method according to the second embodiment, after the first mask layer 20 is formed, the protection film 40 is formed by photolithography and etching of one time. In the pattern formation method according to the second embodiment, the protection film 40 can be formed by a smaller number of processes than in the pattern formation method according to the first embodiment.

As described above, by the pattern formation method according to the embodiment, a pattern with high accuracy can be formed by utilizing the microphase separation of a self-assembling material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention

What is claimed is:

1. A pattern formation method comprising:
   forming a first mask layer on a first surface of a substrate, the first mask layer including a first region and a second region, the first region having a first opening, the second region having a second opening;
   providing a protection film on the first region, the protection film including a first portion and a second portion, the first opening being filled with the first portion, a part of the first region being provided between the second portion and the substrate, and the protection film not being provided in the second opening;
   providing a self-assembling material in the second opening and not in the first opening;
   forming first and second phase regions in the second opening by phase-separating the self-assembling material;
   removing the protection film and the first phase region to form a third opening, the third opening being provided in the second opening, a width of the third opening along a direction parallel to the first surface being narrower than a width of the second opening along the direction; and
   processing the substrate using the first opening and the third opening.

2. The method according to claim 1, wherein a width of the first opening along the direction is wider than the width of the second opening.

3. The method according to claim 1, wherein the forming the protection film includes:
   forming a positive resist film on the first mask layer;
   selectively irradiating the positive resist film with light and then developing the positive resist film to form an opening on the first concave pattern in the positive resist film; and
   providing a material of a protection film in the first concave pattern and in the opening and then removing the positive resist film.

4. The method according to claim 1, wherein the forming the protection film includes:

forming a negative resist film on the first mask layer; and
selectively irradiating the negative resist film with light and then developing the negative resist film to leave the negative resist film in the first opening.

5. The method according to claim 1, wherein the first opening is a pattern for forming an alignment mark.

6. The method according to claim 1, wherein the second opening is a pattern for forming an interconnection.

7. The method according to claim 1, wherein the self-assembling material contains a diblock copolymer.

8. The method according to claim 1, wherein the protection film contains the same polymer as a polymer contained in the first phase region.

9. The method according to claim 1, wherein the forming the first phase region and the second phase region includes phase-separating the self-assembling material along an inner surface of the second opening.

10. The method according to claim 1, wherein providing a self-assembling material includes spin-coating the self-assembling material.

11. The method according to claim 1, wherein the forming the first phase region and the second phase region includes heating the self-assembling material.

12. The method according to claim 1, wherein the removing the protection film and the first phase region includes at least one of wet etching and dry etching.

13. The method according to claim 1, wherein each of the protection film and the first phase region contains one selected from the group consisting of an alkali-soluble material, an acid-soluble material, and a water-soluble material.

14. The method according to claim 1, wherein
the first mask layer has a plurality of first guide patterns and a plurality of second guide patterns,
the first opening is provided between two of the plurality of first guide patterns, and
the second opening is provided between two of the plurality of second guide patterns.

15. The method according to claim 1, wherein providing a protection film includes adjusting a thickness of the protection film to equalize a time of removing the first phase region and a time of removing the protection film.

16. The method according to claim 1, wherein the processing the substrate includes etching the substrate by RIE (reactive ion etching) using the first opening and the third opening as a mask.

17. A method for manufacturing a semiconductor device, comprising:
forming a first mask layer on a first surface of a substrate, the first mask layer including a first region and a second region, the first region having a first opening, the second region having a second opening, the substrate including semiconductor;
providing a protection film on the first region, the protection film including a first portion and a second portion, the first opening being filled with the first portion, a part of the first region being provided between the second portion and the substrate, and the protection film not being provided in the second opening;
providing a self-assembling material in the second opening and not in the first opening;
forming first and second phase regions in the second opening by phase-separating the self-assembling material;
removing the protection film and the first phase region to form a third opening, the third opening provided in the second opening, a width of the third opening along a direction parallel to the first surface being narrower than a width of the second opening along the direction; and
forming a pattern by processing the substrate using the first opening and the third opening.

18. The method according to claim 1, wherein
the second portion is arranged with the part of the first mask layer in a direction perpendicular to the first surface.

* * * * *